United States Patent
Ho et al.

(10) Patent No.: US 9,820,388 B2
(45) Date of Patent: Nov. 14, 2017

(54) PRINTED CIRCUIT BOARD AND METHOD FOR MANUFACTURING SAME

(71) Applicants: FuKui Precision Component (Shenzhen) Co., Ltd., Shenzhen (CN); Zhen Ding Technology Co., Ltd., Tayuan, Taoyuan (TW)

(72) Inventors: Ming-Jaan Ho, New Taipei (TW); Xian-Qin Hu, Shenzhen (CN); Zhi-Tian Wang, Shenzhen (CN)

(73) Assignees: Avary Holding (Shenzhen) Co., Limited., Shenzhen (CN); GARUDA TECHNOLOGY CO., LTD, New Taipei (TW)

( * ) Notice: Subject to any disclaimer, the term of this patent is extended or adjusted under 35 U.S.C. 154(b) by 582 days.

(21) Appl. No.: 14/458,236

(22) Filed: Aug. 12, 2014

(65) Prior Publication Data
US 2015/0040392 A1    Feb. 12, 2015

(30) Foreign Application Priority Data

Aug. 12, 2013  (CN) .................. 2013 1 03478364

(51) Int. Cl.
*H05K 3/28*    (2006.01)

(52) U.S. Cl.
CPC ............. *H05K 3/285* (2013.01); *H05K 3/282* (2013.01); *H05K 2203/013* (2013.01); *H05K 2203/1105* (2013.01); *Y10T 29/49156* (2015.01)

(58) Field of Classification Search
CPC ........ H05K 3/0011; H05K 3/02; H05K 3/282; H05K 3/285; H05K 3/4688; H05K 2203/013; H05K 2203/1105; Y10T 29/49156

USPC ........ 29/846, 848, 850, 885; 427/96.2, 96.4, 427/96.5, 96.3, 96.6, 99.2, 99.3, 99.4
See application file for complete search history.

(56) References Cited

U.S. PATENT DOCUMENTS

| | | | | |
|---|---|---|---|---|
| 5,544,773 A | * | 8/1996 | Haruta | H05K 3/002 216/105 |
| 5,571,608 A | * | 11/1996 | Swamy | H05K 1/0287 174/255 |
| 5,837,398 A | * | 11/1998 | Adams | H01M 2/08 429/174 |
| 6,195,264 B1 | * | 2/2001 | Lauffer | H01L 21/4803 156/578 |
| 6,246,112 B1 | * | 6/2001 | Ball | H01L 23/49822 257/690 |
| 6,379,444 B1 | * | 4/2002 | Adkins | C09D 11/36 106/31.6 |
| 6,645,297 B1 | * | 11/2003 | Suzuki | B05C 1/0808 118/110 |

(Continued)

FOREIGN PATENT DOCUMENTS

| CN | 101014890 A | 8/2007 |
|---|---|---|
| CN | 101490589 A | 7/2009 |

*Primary Examiner* — Peter DungBa Vo
*Assistant Examiner* — Kaying Kue
(74) *Attorney, Agent, or Firm* — Steven Reiss

(57) ABSTRACT

A PCB includes a base layer, a wiring pattern formed on a surface of the base layer, and a protecting layer formed on the wiring pattern. The protecting layer is formed by printing and solidifying an ink on the wiring pattern. The ink includes a cycloaliphatic epoxy resin, a phenoxyl resin solution, a solvent, a hardener, and an antifoaming agent.

18 Claims, 3 Drawing Sheets

(56) References Cited

U.S. PATENT DOCUMENTS

| | | | | |
|---|---|---|---|---|
| 7,847,318 | B2* | 12/2010 | Hirose | H05K 1/0224 |
| | | | | 257/178 |
| 8,288,450 | B2* | 10/2012 | Song | C09J 133/06 |
| | | | | 156/327 |
| 9,485,859 | B1* | 11/2016 | Hu | H01P 3/00 |
| 2001/0042637 | A1* | 11/2001 | Hirose | H05K 3/0035 |
| | | | | 174/255 |
| 2003/0150101 | A1* | 8/2003 | Park | H01B 1/22 |
| | | | | 29/621 |
| 2003/0190540 | A1* | 10/2003 | Shoshi | C07D 209/58 |
| | | | | 430/78 |
| 2005/0180609 | A1* | 8/2005 | Bolis | G06K 9/0002 |
| | | | | 382/116 |
| 2005/0224251 | A1* | 10/2005 | Memis | H01L 23/145 |
| | | | | 174/255 |
| 2005/0288395 | A1* | 12/2005 | Simon | C08G 59/4085 |
| | | | | 523/400 |
| 2007/0090532 | A1* | 4/2007 | Lehman | H01L 21/563 |
| | | | | 257/777 |
| 2007/0147767 | A1 | 6/2007 | Nonaka et al. | |
| 2008/0191353 | A1* | 8/2008 | Japp | H01L 23/145 |
| | | | | 257/759 |
| 2009/0257707 | A1 | 10/2009 | Shibata et al. | |
| 2009/0266788 | A1* | 10/2009 | Chang | H05K 3/061 |
| | | | | 216/17 |
| 2010/0039594 | A1* | 2/2010 | Golan | G02F 1/133305 |
| | | | | 349/122 |
| 2011/0245364 | A1* | 10/2011 | Song | C09J 133/06 |
| | | | | 522/75 |
| 2012/0295071 | A1* | 11/2012 | Sato | G06F 3/041 |
| | | | | 428/188 |
| 2013/0294602 | A1* | 11/2013 | Huxham | H04L 63/0428 |
| | | | | 380/255 |

* cited by examiner

PRINTED CIRCUIT BOARD AND METHOD FOR MANUFACTURING SAME

FIELD

The present disclosure relates to a printed circuit board (PCB) and a method for manufacturing the same.

BACKGROUND

With progress of technology, electronic devices are more and more individualized, and a variety of PCBs are applied to the electronic device, such as a type of PCB with a circuit visible from outside of the PCB. In the PCB, a substrate supporting the circuit and a covering layer covering the circuit are made of a transparent material(s).

BRIEF DESCRIPTION OF THE DRAWING

The components of the drawing are not necessarily drawn to scale, the emphasis instead being placed upon clearly illustrating the principles of the embodiments of the present disclosure.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one." The references "a plurality of" and "a number of" mean "at least two."

Figure 1:
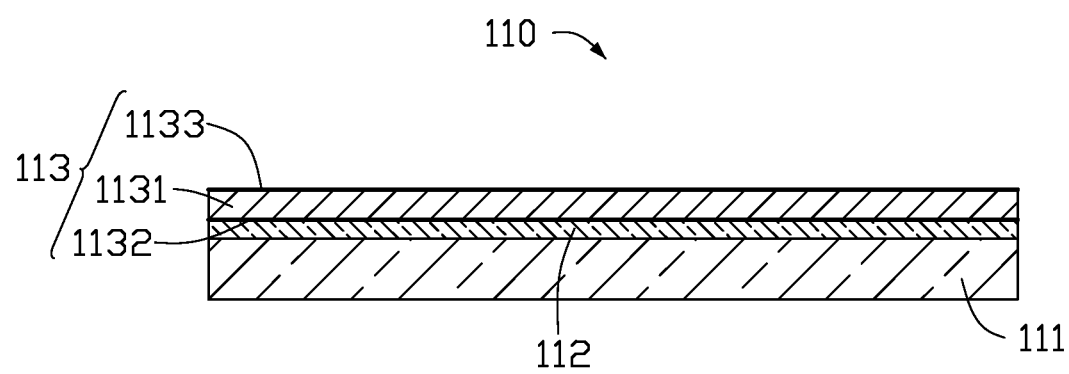
FIG. 1 is a cross-sectional view of an embodiment of a substrate of the present disclosure.
Figure 2:
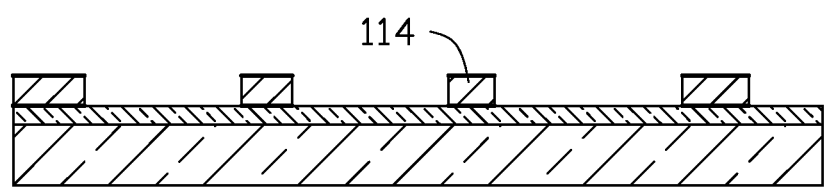
FIGS. 2-3 are diagrammatic views for manufacturing a PCB of an embodiment of the present disclosure, using the substrate of FIG. 1
Figure 3:
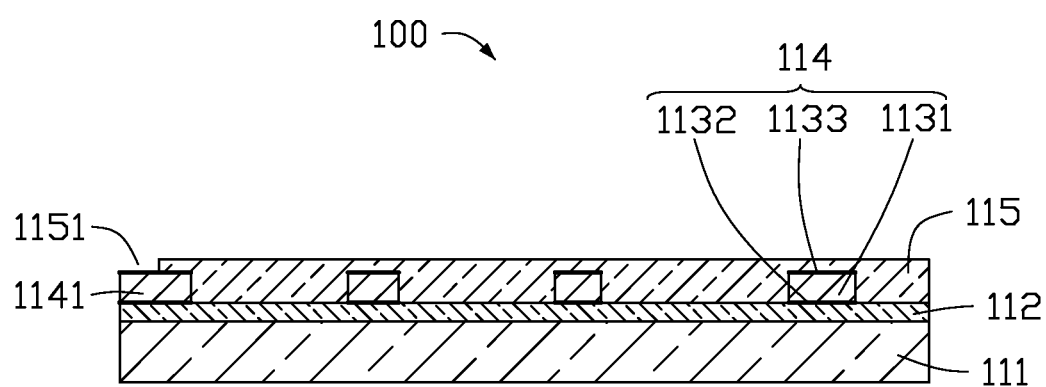

FIGS. 1-3 illustrate an embodiment of a method for manufacturing a PCB. The method includes the following steps.

Referring to FIG. 1, a substrate 110 is provided. In this embodiment, the substrate 110 includes a base layer 111, an adhesive layer 112, and a conductive layer 113. The conductive layer 113 is fixedly connected to the base layer 111 by the adhesive layer 112. The base layer 111 is made of polyethylene naphthalate (PEN). PEN has a excellent optical performance (such as transparence), weather resistance, mechanical property, physical property, air stopping property, and flexible property. In this embodiment, a thickness of the base layer 111 is in a range of 25-50 microns.

The adhesive layer 112 is made of a transparent adhesive.

The conductive layer 113 includes a conductive metal layer 1131, a first blackening layer 1132, and a second blackening layer 1133. The first blackening layer 1132 and the second blackening layer 1133 are formed on two opposite surfaces of the conductive metal layer 1131, respectively. The first blackening layer 1132 is attached to the adhesive layer 112. The first blackening layer 1132 and the second blackening layer 1133 are formed by blacking the conductive metal layer 1131. In this embodiment, the conductive metal layer 1131 is made of copper.

Referring to FIG. 2, a portion of the conductive layer 113 is removed, thereby forming a wiring pattern 114.

In this embodiment, the conductive layer 113 is selectively removed by an image transfer process and an etching process.

Referring to FIG. 3, an ink 115 is printed on the wiring pattern 114 to form a protecting layer, and then a PCB 100 is generated.

In this embodiment, the ink 115 includes a cycloaliphatic epoxy resin, a phenoxyl resin solution, a solvent, a hardener, and an antifoaming agent. In the ink 115, a mass percent of the cycloaliphatic epoxy resin is in a range of 28%-34%, a mass percent of the phenoxyl resin solution is in a range of 10%-20%, a mass percent of the solvent is in a range of 20%-39%, a mass percent of the hardener is in a range of 22%-26%, and a mass percent of the antifoaming agent is in a range of 0.5%-1%. In detail, the phenoxyl resin solution can be a solution with phenoxyl resin dissolved in carbitol acetate. A mass percent of the phenoxyl resin in the phenoxyl resin solution is about 40%. The solvent is ethylene glycol monobutyl ether, and the hardener is methylhexahydrophthalic anhydride. In some embodiments, a phenol aldehyde resin with high transparence can be added to the hardener, thereby enhancing a thixotropy of the hardener.

In this embodiment, the ink 115 employs the methylhexahydrophthalic anhydride serving as the hardener and the ink 115 does not have any catalysts, therefore, a yellowing of the ink 115 can be avoided during a rigidification process of the ink 115.

The protecting layer 115 can be formed by the following method.

First, the ink 115 is formed on the wiring pattern 114 by a screen printing process. Then ink 115 solidified by a baking process to form the protecting layer. Because the ink 115 is formed by the screen printing process, at least one opening 115 can be easily formed in the ink 115 to expose at least one portion of the wiring pattern 114. The exposed portion of the wiring pattern 114 forms an electrical connecting pad 1141.

In this embodiment, a thickness of the protecting layer is in a range of 15-40 microns, and the thickness of the protecting layer is larger than that of the wiring pattern 114.

Further, a surface treatment process can be applied to the PCB 100. For example, marks can be printed on a surface or two opposite surfaces of the PCB, or an organic solderability preservative layer or a Ni—Au layer on a surface of the electrical connecting pad 1141.

By the above described method, the PCB 100 is finally generated. The PCB 100 includes the base layer 111, the adhesive layer 112, the wiring pattern 114, and the protecting layer. The base layer 111 is made of polyethylene naphthalate (PEN), PEN has a excellent optical performance (such as transparence), weather resistance, mechanical property, physical property, air stopping property, and flexible property. In this embodiment, a thickness of the base layer 111 is in a range of 25-50 microns.

The adhesive layer 112 is made of a transparent adhesive.

The wiring pattern 114 includes the conductive metal layer 1131, the first blackening layer 1132, and the second blackening layer 1133. The first blackening layer 1132 and the second blackening layer 1133 are formed on two opposite surfaces of the conductive metal layer 1131, respectively. The first blackening layer 1132 is attached to the adhesive layer 112. The first blackening layer 1132 and the second blackening layer 1133 are formed by blacking the conductive metal layer 1131. In this embodiment, the conductive metal layer 1131 is made of copper.

The protecting layer 115 is formed by printing an ink 115 is printed on the wiring pattern 114. The ink 115 includes a cycloaliphatic epoxy resin, a phenoxyl resin solution, a solvent, a hardener, and an antifoaming agent. In the ink 115, a mass percent of the cycloaliphatic epoxy resin is about 28%-34%, a mass percent of the phenoxyl resin solution is about 10%-20%, a mass percent of the solvent is about 20%-39%, a mass percent of the hardener is about 22%-26%, and a mass percent of the antifoaming agent is about 0.5%-1%. In detail, the solvent is ethylene glycol monobutyl ether, and the hardener is methylhexahydrophthalic anhydride. In some embodiments, a phenol aldehyde resin with high transperance can be added to the hardener, thereby enhancing a thixotropy of the hardener.

In this embodiment, the ink 115 employs the methylhexahydrophthalic anhydride serving as the hardener and the ink 115 does not have any catalysts, therefore, a yellowing of the ink 115 can be avoided during a rigidification process of the ink 115.

In the PCB 100 manufactured by the above described method, the wiring pattern 114 can be observed through the base layer 111 and the protecting layer 115. The PCB 100 has an excellent flexible property.

Because the protecting layer is formed by a print process instead of a pressing process, therefore, the PCB 100 can be kept from being wrinkled during a manufacturing process of the protecting layer.

It is believed that the present embodiments and their advantages will be understood from the foregoing description, and it will be apparent that various changes may be made thereto without departing from the scope of the disclosure or sacrificing all of its material advantages, the examples hereinbefore described merely being exemplary embodiments of the disclosure.

What is claimed is:

1. A PCB comprising:
    a base layer;
    a wiring pattern formed on a surface of the base layer; and
    a protecting layer formed on the wiring pattern by printing and solidifying an ink on the wiring pattern, the ink comprising a cycloaliphatic epoxy resin, a phenoxyl resin solution, a solvent, a hardener, and an antifoaming agent, a mass percent of the cycloaliphatic epoxy resin being in a range of 28%-34%, a mass percent of the phenoxyl resin solution being in a range of 10%-20%, a mass percent of the solvent being in a range of 20%-39%, a mass percent of the hardener being in a range of 22%-26%, and a mass percent of the antifoaming agent being in a range of 0.5%-1%.

2. The PCB of claim 1, wherein the phenoxyl resin solution is a solution with phenoxyl resin dissolved in carbitol acetate.

3. The PCB of claim 2, wherein a mass percent of the phenoxyl resin in the phenoxyl resin solution is 40%.

4. The PCB of claim 1, wherein the solvent is ethylene glycol monobutyl ether.

5. The PCB of claim 1, wherein the hardener comprises a phenol aldehyde resin added thereto.

6. The PCB of claim 1, wherein the wiring pattern comprises a conductive metal layer, a first blackening layer, and a second blackening layer, the first blackening layer and the second blackening layer are formed on two opposite surfaces of the conductive metal layer, respectively.

7. The PCB of claim 6, further comprising an adhesive layer, the conductive metal layer being fixed connected to the base layer by the adhesive layer, and the first blackening layer be attached to the adhesive layer.

8. The PCB of claim 1, wherein a thickness of the base layer is in a range of 25-50 microns.

9. The PCB of claim 1, wherein a thickness of the protecting layer is in a range of 15-40 microns.

10. A method for manufacturing a PCB, comprising steps:
    providing a substrate, the substrate comprising a base layer and a conductive layer;
    selectively removing a portion of the conductive layer to form a wiring pattern; and
    printing an ink on the wiring pattern, the ink comprising a cycloaliphatic epoxy resin, a phenoxyl resin solution, a solvent, a hardener, and an antifoaming agent;
    solidifying the ink to form a protecting layer on the wiring pattern, a mass percent of the cycloaliphatic epoxy resin being in a range of 28%-34%, a mass percent of the phenoxyl resin solution being in a range of 10%-20%, a mass percent of the solvent being in a range of 20%-39%, a mass percent of the hardener being in a range of 22%-26%, and a mass percent of the antifoaming agent being in a range of 0.5%-1%.

11. The method of claim 10, wherein the phenoxyl resin solution is a solution with phenoxyl resin dissolved in carbitol acetate.

12. The method of claim 11, wherein a mass percent of the phenoxyl resin in the phenoxyl resin solution is 40%.

13. The method of claim 10, wherein the solvent is ethylene glycol monobutyl ether.

14. The method of claim 10, wherein the hardener comprises a phenol aldehyde resin added thereto.

15. The method of claim 10, wherein the wiring pattern comprises a conductive metal layer, a first blackening layer, and a second blackening layer, the first blackening layer and the second blackening layer are formed on two opposite surfaces of the conductive metal layer, respectively.

16. The method of claim 15, wherein the substrate comprises an adhesive layer, the conductive metal layer being fixed connected to the base layer by the adhesive layer, and the first blackening layer be attached to the adhesive layer.

17. The method of claim 10, wherein a thickness of the base layer is in a range of 25-50 microns.

18. The method of claim 10, wherein a thickness of the protecting layer is in a range of 15-40microns.

* * * * *